United States Patent
Singer et al.

(10) Patent No.: US 6,927,403 B2
(45) Date of Patent: Aug. 9, 2005

(54) ILLUMINATION SYSTEM THAT SUPPRESSES DEBRIS FROM A LIGHT SOURCE

(75) Inventors: Wolfgang Singer, Aalen (DE); Martin Antoni, Aalen (DE); Johannes Wangler, Königsbronn (DE); Wilhelm Egle, Aalen (DE); Vadim Yevgenyevich Banine, Helmond (NL); Erik Roelof Loopstra, Heeze (NL)

(73) Assignees: Carl Zeiss SMT AG, Oberkochen (DE); ASML Lithography B.V., Veldhoven (NL)

( * ) Notice: Subject to any disclaimer, the term of this patent is extended or adjusted under 35 U.S.C. 154(b) by 58 days.

(21) Appl. No.: 10/216,547

(22) Filed: Aug. 9, 2002

(65) Prior Publication Data

US 2003/0095623 A1 May 22, 2003

(30) Foreign Application Priority Data

Aug. 10, 2001 (DE) .......................................... 101 38 284

(51) Int. Cl.$^7$ .............................................. G01N 21/64
(52) U.S. Cl. ................. 250/461.1; 250/458.1; 250/492.2; 250/492.1; 250/492.22; 250/504 R
(58) Field of Search .................. 359/727, 487, 359/633, 623, 366, 624; 355/51; 378/34; 218/120; 250/458.1, 461.1, 492.1, 492.2, 492.22, 504 R (56) References Cited

U.S. PATENT DOCUMENTS

| | | | | |
|---|---|---|---|---|
| 4,688,932 A | * | 8/1987 | Suzuki ......................... 355/51 |
| 5,071,240 A | * | 12/1991 | Ichihara et al. ............. 359/366 |
| 5,715,084 A | * | 2/1998 | Takahashi et al. .......... 359/487 |
| 5,763,930 A | | 6/1998 | Partlo .......................... 250/504 |
| 5,768,339 A | | 6/1998 | O'Hara ........................ 378/147 |
| 5,796,524 A | * | 8/1998 | Oomura ....................... 359/633 |
| 5,805,356 A | * | 9/1998 | Chiba .......................... 359/727 |
| 6,064,072 A | | 5/2000 | Partlo et al. ................ 250/504 |
| 6,198,793 B1 | | 3/2001 | Schultz et al. ............... 378/34 |
| 6,229,647 B1 | * | 5/2001 | Takahashi et al. .......... 359/487 |
| 6,438,199 B1 | * | 8/2002 | Schultz et al. ............... 378/34 |
| 6,452,661 B1 | | 9/2002 | Komatsuda ................... 355/67 |
| 6,498,315 B1 | * | 12/2002 | Betz et al. ................... 218/120 |
| 6,498,351 B1 | * | 12/2002 | Kruizinga et al. ........ 250/492.2 |
| 6,583,937 B1 | * | 6/2003 | Wangler et al. ............. 359/624 |
| RE38,438 E | * | 2/2004 | Takahashi ................... 359/727 |

FOREIGN PATENT DOCUMENTS

| | | | |
|---|---|---|---|
| DE | 3001059 | 4/1983 | ............ G21K/1/02 |
| EP | 0939341 | 9/1999 | ............ G03F/7/20 |
| EP | 0 987 601 A2 | 3/2000 | |
| EP | 1 004 937 | 5/2000 | |
| EP | 1035445 | 9/2000 | ............ G03F/7/20 |
| EP | 0 987 601 A3 | 10/2001 | |
| WO | WO 99/27542 | 6/1999 | |
| WO | WO 00/63922 | 10/2000 | ............ G21K/1/06 |
| WO | WO 01/08162 | 2/2001 | ............ G21K/1/06 |

* cited by examiner

Primary Examiner—Frank G. Font
Assistant Examiner—Mary El-Shammaa
(74) Attorney, Agent, or Firm—Ohlandt, Greeley, Ruggiero & Perle, LLP (57) ABSTRACT

There is provided an illumination system for wavelengths of ≦193 nm. The illumination system includes an object plane, a plane conjugated to the object plane, a first collector between the object plane and the conjugated plane, and a second collector after the conjugated plane. The first collector focuses a beam bundle of rays from the object plane in the conjugated plane. At least one of the first and second collectors includes a mirror shell. The rays strike the mirror shell at an angle of incidence of less than 20° relative to a surface tangent of the mirror shell.

29 Claims, 8 Drawing Sheets

Table 1: Design data of the system according to Figure 1a

| Coordinate system of the | Surface vertex | | | Field radius 138 mm | | | |
|---|---|---|---|---|---|---|---|
| | Y | Z | α | R | KY | ZV | ZH |
| Source | 5626.666 | -483.841 | 94.725 | Source | | | |
| H1 | 5637.136 | -482.975 | 94.725 | 22.325 | -1.266 | 88.879 | 169.385 |
| H2 | 5633.864 | -483.246 | 94.725 | 15.052 | -1.175 | 94.873 | 173.085 |
| H3 | 5631.721 | -483.423 | 94.725 | 10.435 | -1.118 | 99.954 | 175.900 |
| H4 | 5630.210 | -483.548 | 94.725 | 7.253 | -1.081 | 102.833 | 177.676 |
| H5 | 5629.144 | -483.636 | 94.725 | 5.041 | -1.057 | 105.048 | 179.531 |
| H6 | 5628.397 | -483.698 | 94.725 | 3.508 | -1.040 | 107.562 | 182.354 |
| H7 | 5627.828 | -483.745 | 94.725 | 2.348 | -1.029 | 107.921 | 183.901 |
| H8 | 5627.453 | -483.776 | 94.725 | 1.587 | -1.020 | 108.992 | 185.856 |
| E1 | 5828.340 | -467.172 | 94.725 | 26.809 | -0.969 | 362.936 | 480.716 |
| E2 | 5821.288 | -467.754 | 94.725 | 18.468 | -0.978 | 362.334 | 470.023 |
| E3 | 5819.214 | -467.926 | 94.725 | 12.859 | -0.985 | 365.143 | 466.027 |
| E4 | 5815.824 | -468.206 | 94.725 | 9.081 | -0.989 | 366.195 | 463.153 |
| E5 | 5810.782 | -468.623 | 94.725 | 6.474 | -0.992 | 364.030 | 457.327 |
| E6 | 5807.606 | -468.885 | 94.725 | 4.606 | -0.995 | 363.503 | 454.105 |
| E7 | 5794.265 | -469.988 | 94.725 | 3.337 | -0.996 | 353.681 | 440.165 |
| E8 | 5787.057 | -470.584 | 94.725 | 2.372 | -0.997 | 349.657 | 433.463 |
| Intermediate focus | 4131.764 | -607.401 | 94.725 | Intermediate focus | | | |
| S1 | 4142.989 | -606.473 | 94.725 | 22.469 | -0.990 | 2001.465 | 2412.000 |
| S2 | 4139.396 | -606.770 | 94.725 | 15.289 | -0.993 | 2006.899 | 2386.000 |
| S3 | 4137.061 | -606.963 | 94.725 | 10.616 | -0.995 | 2010.777 | 2366.000 |
| S4 | 4135.509 | -607.091 | 94.725 | 7.508 | -0.997 | 2014.575 | 2357.000 |
| S5 | 4134.407 | -607.182 | 94.725 | 5.301 | -0.998 | 2013.942 | 2346.000 |
| S6 | 4133.635 | -607.246 | 94.725 | 3.753 | -0.998 | 2013.363 | 2337.000 |
| S7 | 4133.088 | -607.291 | 94.725 | 2.656 | -0.999 | 2013.021 | 2329.000 |
| S8 | 4132.699 | -607.324 | 94.725 | 1.875 | -0.999 | 2016.184 | 2325.000 |
| First grid elements | 643.159 | -895.749 | 81.725 | Planar | | | |
| Second grid elements | 1481.823 | -1222.309 | 240.725 | -1312.066 | Spherical | | |
| N1 | 412.105 | 322.283 | -84.717 | -595.820 | -0.094 | | |
| N2 | 458.587 | -914.778 | 208.725 | Torus, RY = -1102.3212, RX = -1090.277 | | | |
| Field-shaping mirror (hyperboloid) | -215.988 | 97.641 | -3.672 | -73.930 | -1.125 | | |
| Reticle | 0.000 | 0.000 | 0 | Planar | | | |
| EP (Entrance pupil) | -138.000 | -1312.982 | 0 | | | | |

Fig. 4

Table 2: Design data of the system according to Figure 1c

| | X | Y | Z | α | β | γ | R | KY | ZV | ZH |
|---|---|---|---|---|---|---|---|---|---|---|
| Source | -1760.651 | -2518.151 | -1028.295 | -90.000 | 22 | 90 | | | | |
| B1 | -1772.616 | -2548.259 | -1028.295 | -90.000 | 22 | 90 | 64.124 | -0.950 | 225.164 | 419.074 |
| B2 | -1766.373 | -2532.314 | -1028.295 | -90.000 | 22 | 90 | 30.367 | -0.976 | 214.248 | 427.142 |
| B3 | -1763.248 | -2524.578 | -1028.295 | -90.000 | 22 | 90 | 13.826 | -0.989 | 212.877 | 424.448 |
| B4 | -1761.826 | -2521.019 | -1028.295 | -90.000 | 22 | 90 | 6.265 | -0.995 | 211.275 | 424.912 |
| B5 | -1761.187 | -2519.428 | -1028.295 | -90.000 | 22 | 90 | 2.753 | -0.998 | 206.018 | 433.540 |
| Diaphragm in the collector | -1683.107 | -2326.224 | -1028.295 | -90.000 | 22 | 90 | Diaphragm, diameter 42 mm | | | |
| Intermediate focus | -824.135 | -200.191 | -1028.295 | -90.000 | 11 | 90 | Torus: RY = -2134.454, RX = -2056.743 | | | |
| Second collector, normal incidence, toric | 0.000 | 1839.836 | -1028.295 | -90.000 | 0 | 0 | Planar | | | |
| Field facets (planar) | 0.000 | 739.613 | -1350.827 | 79.500 | 0 | 0 | -1351.531 | | | |
| Pupil facets (spherical) | 0.000 | 1579.836 | 324.998 | 240.000 | 0 | 0 | -678.423 | -0.103 | | |
| First imaging mirror (ellipsoid) | 0.000 | 471.596 | -914.778 | 268.248 | 0 | 0 | -1116.003 | | | |
| Second imaging mirror (sphere) | 0.000 | 458.387 | 97.641 | 208.225 | 0 | 0 | -73.930 | -1.125 | | |
| Field-forming mirror (hyperboloid) | 0.000 | -215.988 | 0.000 | -3.672 | 0 | 0 | Planar | | | |
| Reticle | 0.000 | 0.000 | 0.000 | 0.000 | 0 | 0 | | | | |
| Entrance pupil | 0.000 | -138.000 | -1312.982 | 0.000 | 180 | 0 | | | | |

Fig. 5

Table 3: Design data for the optical components of the system according to Figure 2

| Position | Y | Z | α | vertex radius of curvature | conical constant |
|---|---|---|---|---|---|
| Light source 1 | 2148.137 | -1562.205 | 70.862 | - no mirror surface - | |
| Planar mirror or spectral filter | 1184.513 | -1227.797 | 147.434 | Planar | |
| Intermediate focus Z | 883.404 | -893.382 | 42.000 | - no mirror surface - | |
| First faceted optical element 102 | 302.599 | -248.333 | 36.000 | -898.54 | spherical |
| Second faceted optical element 104 | 773.599 | -1064.129 | 214.250 | -1090.15 | spherical |
| Mirror 106 | 126.184 | -250.216 | 31.500 | 288.1 | spherical |
| Mirror 108 | 372.926 | -791.643 | 209.600 | -855.8 | spherical |
| Mirror vertex of mirror 110 | -227.147 | 118.541 | -4.965 | -80.5 | -1.148570 |
| Object plane 114 | 0.000 | 0.000 | 0.000 | planar | |
| Entrance pupil E | -130.000 | -1236.867 | 0.000 | - no mirror surface - | |

Fig. 6

ILLUMINATION SYSTEM THAT SUPPRESSES DEBRIS FROM A LIGHT SOURCE

CROSS REFERENCE TO RELATED APPLICATIONS

The present application is claiming priority of German Patent Application Serial No. DE 101 38 284.7-51, filed on Aug. 10, 2001.

BACKGROUND OF THE INVENTION

1. Field of the Invention

The present invention concerns an illumination system for wavelengths of ≦193 nm, wherein the illumination system includes an object plane and a plane conjugated to the object plane, and also includes a collector unit having a mirror shell. A beam having a bundle of rays is emitted from a light source situated in the object plane. The rays impinge on the mirror shell at an angle of incidence of <20° relative to a surface tangent of the mirror shell. This configuration minimizes degradation of the optical components of the illumination system that could be caused by debris produced by the light source.

2. Description of the Prior Art

In order to further reduce pattern widths for electronic components, particularly to the submicron range, it is necessary to reduce the wavelengths of the light utilized for microlithography. The use of light with wavelengths smaller than 193 nm is conceivable, for example, by lithography with soft x-rays, so-called EUV lithography.

EUV lithography is one of the most promising future lithography techniques. At present, wavelengths in the range of 11–14 nm, especially 13.5 nm, are being discussed as wavelengths for EUV lithography, with a numerical aperture of 0.2–0.3. Image quality in EUV lithography is determined, on the one hand, by a projection objective, and, on the other hand, by an illumination system. The illumination system should provide the most uniform possible illumination of a field plane, in which a pattern-bearing mask, a so-called reticle, is arranged. The projection objective images an object situated in the field plane into an image plane, a so-called wafer plane, in which a light-sensitive object is arranged. Projection exposure systems for EUV lithography are designed with reflective optical elements. The form of the field of an EUV projection exposure system is typically that of an annular or ring field. Projection systems usually operate in scanning mode. An EUV projection exposure system has been made known, for example, from EP-A-1,026,547 or EP-A-0 939,341.

Collectors in refractive illumination systems are well known, for example see Lexikon der Optik, Leipzig 1990, edited by Heinz Haferkorn, page 183. Collectors in EUV-systems function in a manner similar to that of collectors in refractive systems.

Both EP-A-1,026,547 and EP-A-0 939,341 show illumination systems, in which the light of a light source is taken up by a first collector and is imaged into an intermediate image in an intermediate image plane. It has become known from EP-A-0 939,341 to arrange a second collector in the light path from the light source to the field plane after the intermediate image plane. The collectors shown in both EP-A 1,026,547 and EP-A-0 939,341 are normal incidence mirrors with multilayer coatings.

If, for example, light sources such as those described in U.S. Pat. No. 5,763,930 are used as light sources for EUV lithography, then the problem arises that debris, for example, abraded material or dirt particles, contaminate surfaces of the normal-incidence mirrors after a short time and thus reduce the reflectivity of these components.

Nested collectors for wavelengths of ≦193 nm, particularly wavelengths in the range of x-ray radiation, have become known from a multiple number of documents.

Thus, U.S. Pat. No. 5,768,339 shows a collimator for x-ray radiation, wherein the collimator has several nested paraboloid-shaped reflectors. The collimator according to U.S. Pat. No. 5,768,339 serves for shaping an isotropically emitted beam bundle of an x-ray light source into a parallel beam.

A nested collector for x-ray radiation that serves for collimating isotropic x-ray radiation emitted from a source into a parallel beam bundle, as in the case of U.S. Pat. No. 5,768,339, has become known from U.S. Pat. No. 1,865,441.

U.S. Pat. No. 5,745,547 shows several arrangements of multi-channel optics, which serve for focusing radiation of a source, particularly x-ray radiation, via multiple reflections, at one point. In order to achieve a particularly high transmission efficiency, U.S. Pat. No. 5,745,547 proposes elliptically shaped reflectors.

An arrangement has become known from DE 3,001,059 C2 for use in x-ray radiation lithography systems, which has parabolic nested mirrors arranged between an x-ray radiation source and a mask. These mirrors are arranged in such a way that divergent x-rays are shaped into a parallel-running output beam bundle.

An arrangement of nested reflectors that has become known from WO 99/27542 is used in an x-ray proximity lithography system for refocusing light of a light source so that a secondary light source is formed. The nested reflectors may have an ellipsoid form.

A nested reflector for high-energy photon sources has become known from U.S. Pat. No. 6,064,072. The nested reflector serves for shaping divergent x-rays into a parallel-running beam bundle.

WO 00/63922 shows a nested collector that serves for collimating a neutron beam.

A nested collector for x-rays has become known from WO 01/08162, which is characterized by a surface roughness of less than 12 Å rms of the inner, reflecting surfaces of individual mirror dishes. The collectors shown in WO 01/08162 also comprise systems with multiple reflections, particularly Wolter systems, and are characterized by a high resolution, as is required, for example, for x-ray lithography.

SUMMARY OF THE INVENTION

An object of the present invention is to create an illumination system in which the disadvantages known from EP-A-1,026,547 and EP-A-0 939,341 are avoided.

Ordinarily, debris from a light source can degrade optical components in an illumination system. The present invention concerns an illumination system, and more particularly, an illumination system for wavelengths of ≦193 nm, arranged so that such debris is less likely to cause such degradation. The arrangement also minimizes reflection losses in the illumination system.

According to a further aspect of the present invention at least one collector, preferably the collector closest to a light source, comprises at least one mirror shell on which rays of a beam bundle emerging from a light source situated in an object plane strike at angles of incidence of less than 20° relative to a respective surface tangent of the mirror shell. It is also preferred that such a collector is designed as a nested collector comprising a plurality of mirror shells rotationally symmetric around an optical axis.

Figure 1A:
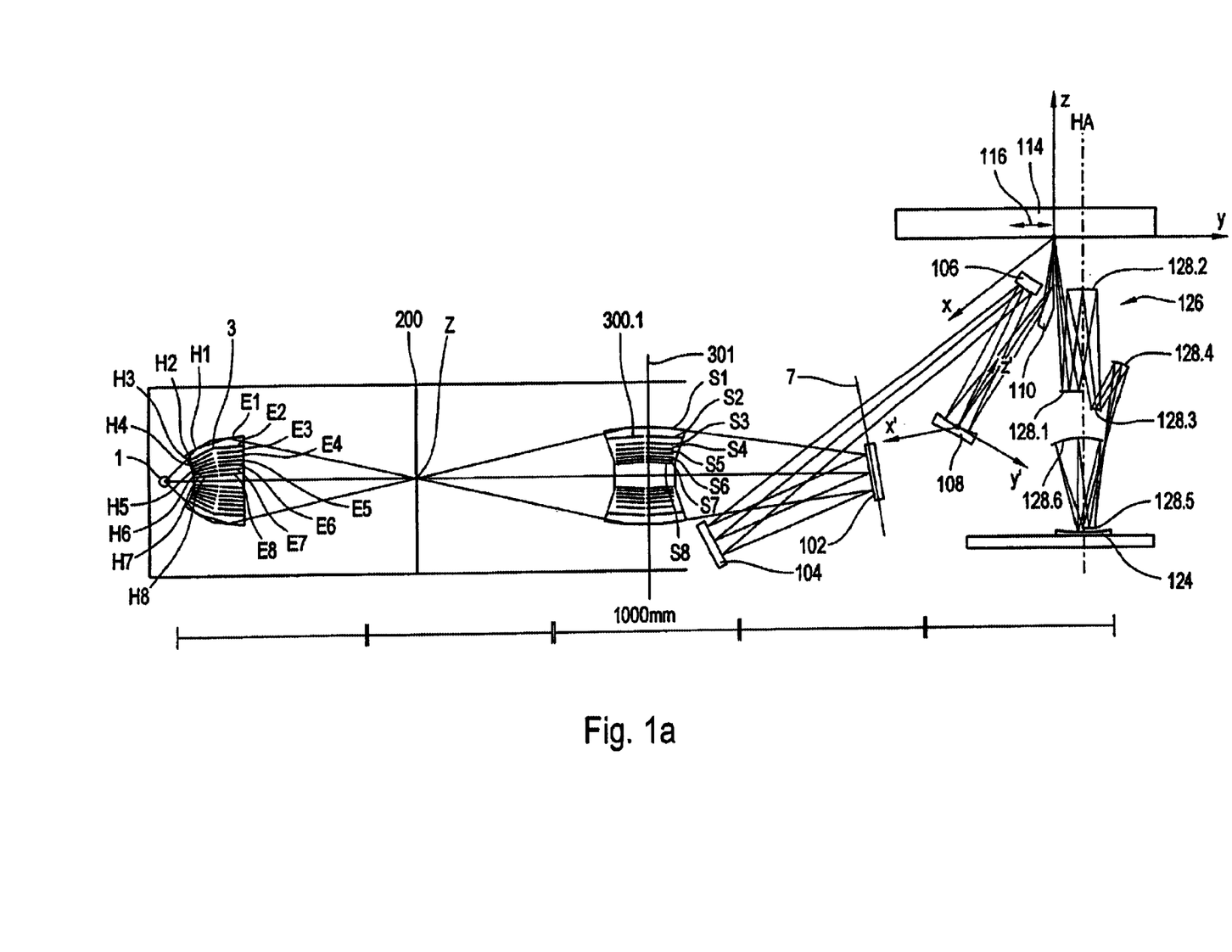
FIG. 1a shows a structure, in principle, of a projection exposure system with an illumination system according to the present invention with two nested collectors and an intermediate image.

In a plane conjugated to an object plane, an intermediate image is formed, for example, of a light source arranged in the object plane. A first room and a second room can be formed in an illumination system with a plane conjugated to the object plane, wherein the first room is spatially separated from the second room, so that for example, debris cannot reach from the first room into the second room. For this purpose, a device or devices are provided next to the plane in which the intermediate image is formed, for the spatial separation of the first room from the second room. Such devices may comprise, for example, devices that separate pressures in the first room and the second room, as well as devices that shield the second room from the first room with respect to heat radiation. Referring to FIG. 1 for example, an arrangement of devices near the plane conjugated to the object plane is understood to mean an arrangement with a distance that is smaller than $1/10^{th}$ of the distance from a light source (1) to a conjugated plane (200).

A nearly uniform illumination in a plane can be achieved by a configuration of collector unit(s) as a nested collector or nested collectors. Such a nested collector comprises a plurality of mirror shells that are preferably shaped as annular segments of an ellipsoid. If a collector comprises annular segments of an ellipsoid, then a convergent beam bundle will be formed.

In an alternative embodiment of the present invention, it is provided that the nested collector comprises at least one mirror shell with a first annular segment and a second annular segment. Preferably, the first annular segment is a segment of a hyperboloid and the second segment is a segment of an ellipsoid. In the case of such a collector, a convergent beam bundle is formed. Mirror systems comprising hyperboloid-shaped or ellipsoid-shaped mirrors have become known from the literature as Wolter systems. For Wolter systems, reference is made to Wolter, Annalen der Physik 10, 94–114, 1952, the disclosure content of which is fully incorporated in the present application.

BRIEF DESCRIPTION OF THE DRAWINGS

The present invention will be described below, for example, on the basis of the drawings.

Here:

FIG. 4 is a presentation of Table 1, which provides design data of the system according to FIG. 1a.

DESCRIPTION OF THE INVENTION

The invention provides for an illumination system for wavelengths of ≦193 nm, comprising an object plane, a plane conjugated to the object plane, a first collector between the object plane and the conjugated plane, and a second collector after the conjugated plane. The first collector focuses a beam bundle of rays from the object plane in the conjugated plane. At least one of the first and second collectors includes a mirror shell, and the rays strike that mirror shell at an angle of incidence of less than 20° relative to a surface tangent of the mirror shell. By using a collector having a mirror shell onto which rays strike at an angle of incidence of less than 20° relative to a surface tangent of the mirror shell, reflection losses can be minimized.

A normal-incidence mirror typically has a multi-layer coating for reflecting light. This multi-layer coating is susceptible to degradation, i.e., degradation of reflective capability, from debris. Collectors in accordance with the present invention are configured for grazing incidence. A grazing incidence mirror typically does not require a multi-layer coating. Therefore, the grazing incidence collectors are less susceptible to degradation from debris.

FIG. 1a shows in a basic diagram an EUV-projection exposure system for production of microelectronic components, for example, with an illumination system according to the present invention. The illumination system comprises a light source 1, two nested collectors, i.e. collectors 3 and 300.1, a first optical element 102, a second optical element 104 and three mirrors 106, 108 and 110. Light source 1 is arranged in the present case in an object plane of the illumination system. Light emitted from light source 1, of which only three representative rays are depicted, is collected by collector 3 according to the present invention and focused by collector 3 in a plane 200, which is conjugated to the object plane. An intermediate image Z of light source 1 is then formed in plane 200.

A nested collector, e.g., collectors 3 and 300.1, is configured with a plurality of mirror shells. The shells are arranged around a common axis of rotation (RA), inside of one another.

For the formation of a convergent beam bundle, whose focus lies in plane 200, mirror shells of collector 3 can be annular segments, which are segments of ellipsoids. In an alternative embodiment, at least one mirror shell of collector 3 can comprise two segments, i.e., a first segment and a second segment. The first segment can be a segment of a hyperboloid and the second segment can be a segment of an ellipsoid.

A light bundle exiting from intermediate image Z will be deflected by a second collector, i.e., collector 300.1, which is also presently designed as a nested collector, onto first optical element 102, which includes a plurality of raster elements, so-called field honeycombs. First optical element 102 is also denoted as a field honeycomb mirror. Second optical element 104 also includes a plurality of raster elements, which are denoted pupil honeycombs. An illumination system with a first optical element having raster elements and a second optical element having raster elements is disclosed in U.S. Pat. No. 6,198,793 B1, the content of which is fully incorporated in the present application.

Mirrors 106, 108 and 110 are optical elements for directing rays of the light bundle, and for shaping and illuminating a field in field plane 114. They also serve for filling an exit pupil of the illumination system. The exit pupil coincides with an entrance pupil of a projection objective and is not represented in FIGS. 1a and 1c. A reticle in field plane 114 is a reflection mask. The reticle can travel in a direction 116 in the EUV projection system when the EUV projection system is designed as a scanning system.

A projection objective 126, for example, with six mirrors 128.1, 128.2, 128.3, 128.4, 128.5, 128.6, as described in EP-A-1,035,445, the disclosure content of which is fully incorporated herewith, images the reticle onto a light sensitive object 124 to be exposed. Mirrors 128.1, 128.2, 128.3, 128.4, 128.5, 128.6 are arranged centered around an optical axis HA.

Light source 1 is a plasma light source, for example, particularly a laser plasma source or a pinch plasma source, or a light source as disclosed in U.S. Pat. No. 5,763,930. Devices for spatial separation of the light source 1 and collector 3 from the other optical elements of the illumination system, which are arranged in the light path from light source 1 to the field plane 114 after collector 3, are shown in more detail in FIGS. 3a and 3b. In the embodiment shown, the first optical element of the illumination system that is arranged in the light path from the light source to the field plane after collector 3 is a second nested collector, i.e., collector 300.1. Preferably, the devices for separating the light source 1 and collector 3 from the rest of the illumination system are arranged in or near plane 200. An arrangement of such devices near plane 200 is to be understood as an arrangement at a distance that is less than $\frac{1}{10}^{th}$ of the distance from light source 1 to plane 200.

Figure 1B:
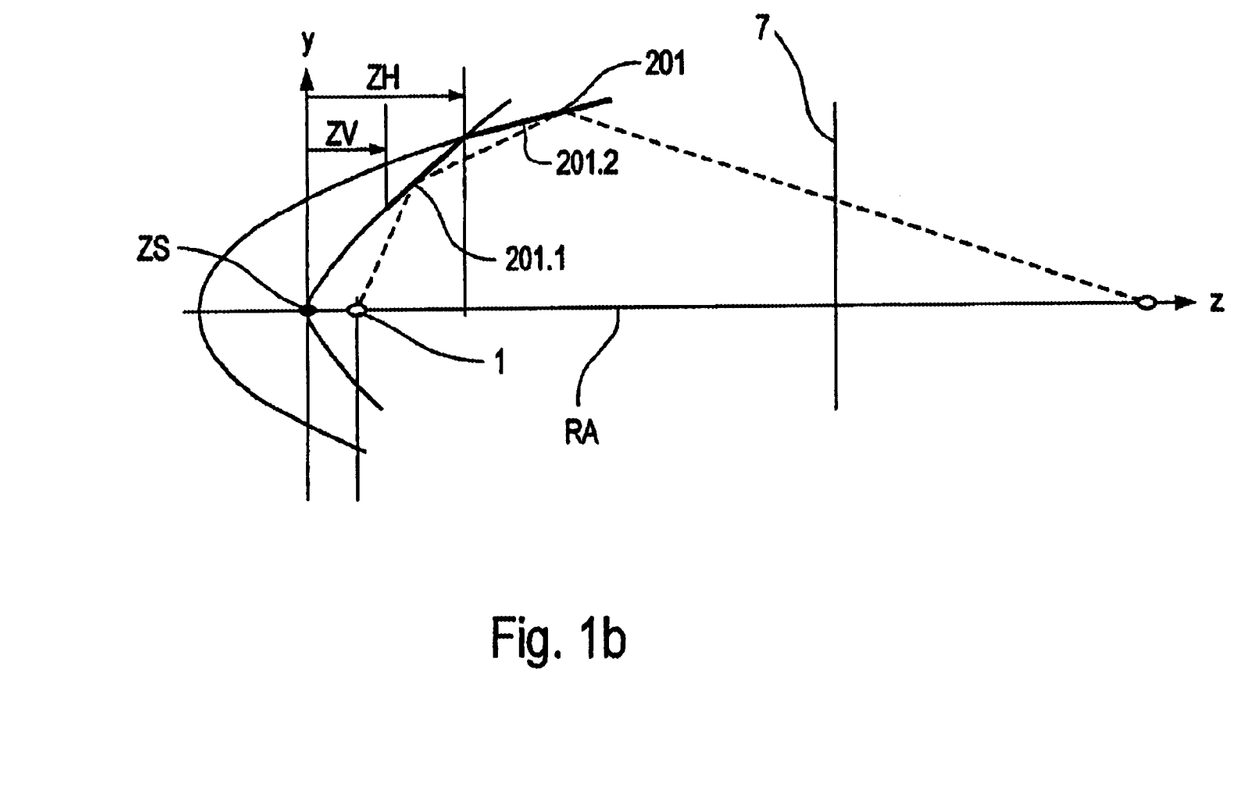
FIG. 1b shows a shell of a nested collector with a first segment and a second segment.

Characteristic coordinates of a segment of a mirror shell are shown, for example, in FIG. 1b for a mirror shell 201 of collectors 3 and 300.1. In the embodiment shown in FIG. 1b, mirror shell 201 is configured with a first segment 201.1 and a second segment 201.2. FIG. 1b also shows parameters ZH, ZV and ZS for first segment 201.1. ZS denotes a z-position of a surface vertex referred to the position of light source 1, while ZV and ZH denote the initial and final positions of the segment referred to the position of the surface vertex ZS. If the nested collector comprises mirror shells with more than one segement, e.g., two segments as shown in FIG. 1b, then the references ZS, ZH and ZV are used in an analogous manner also for the second segment 201.2.

Figure 4:
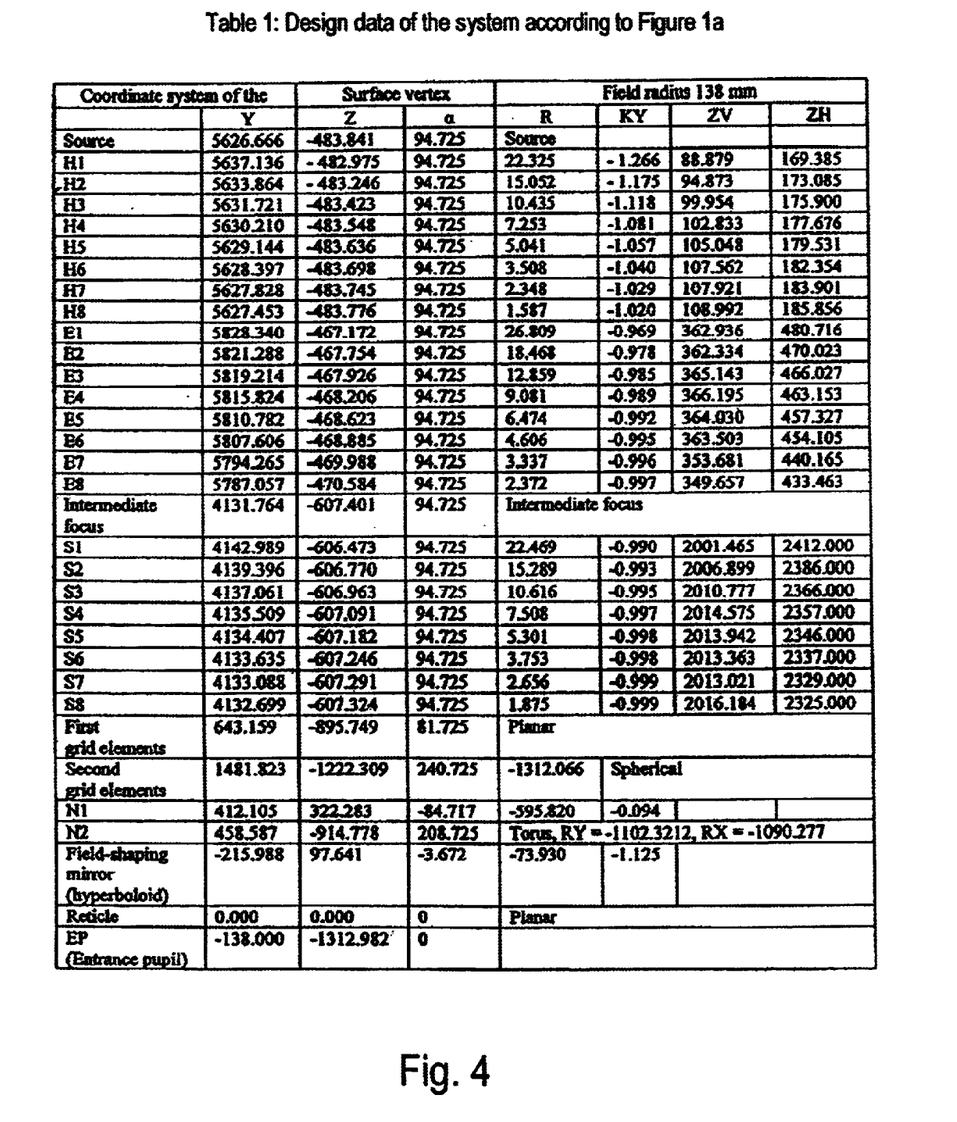

FIG. 4 is a presentation of Table 1, which provides design data of the system according to FIG. 1a. Table 1 gives the surface vertex positions referred to a reference coordinate system in field plane 114 as well as the surface parameters for the example of embodiment according to FIG. 1a.

In Table 1, H1–H8 designate the first segments (hyperboloids) of collector 3, and E1–E8 denote the second segments (ellipsoids) of collector 3. S1 to S8 denote the shells of collector 300.1, which is formed by segments of ellipsoids. N1 and N2 denote first and second imaging mirrors, i.e., mirrors 106 and 108, respectively, of the illumination system. Mirror 106 is shaped as an ellipsoid, and mirror 108 is shaped as a toroid. Y and Z denote position vectors of a local surface vertex relative to a reference coordinate system in field plane 114. α denotes an angle of rotation of local coordinate systems, which have a local origin at surface vertices of each optical element, around the x-axis in a clockwise direction, referred to a reference coordinate system in the field plane 114. The position of the local coordinate system will be determined by translation and exclusive rotation around α referred to the reference coordinate system in field plane 114. All coordinate systems, i.e., reference coordinate system and local coordinate systems, are right-handed. In FIG. 1a the reference coordinate system in field plane 114 is shown. The coordinates of the reference system are denoted with x,y,z. As a further example, the local coordinate system is shown for mirror 110. The coordinates are denoted with x', y', z'. In Table 1, R denotes radius of curvature in the surface vertex, and KY is a conical constant, of each optical element 102 and 104, and each mirror 106, 108 and 110, or each segment of the shells of collectors 3 and 300.1. The significance of ZV and ZH is explained earlier in the description of FIG. 1b.

A collection aperture of collector 3 amounts to approximately 0.72. The illumination system fills a field of 8-mm diameter in the scanning direction 116 and 108-mm width. The aperture at the reticle in field plane 114 amounts to 0.03125. The system is designed for a field radius-of 138 mm.

Figure 1C:
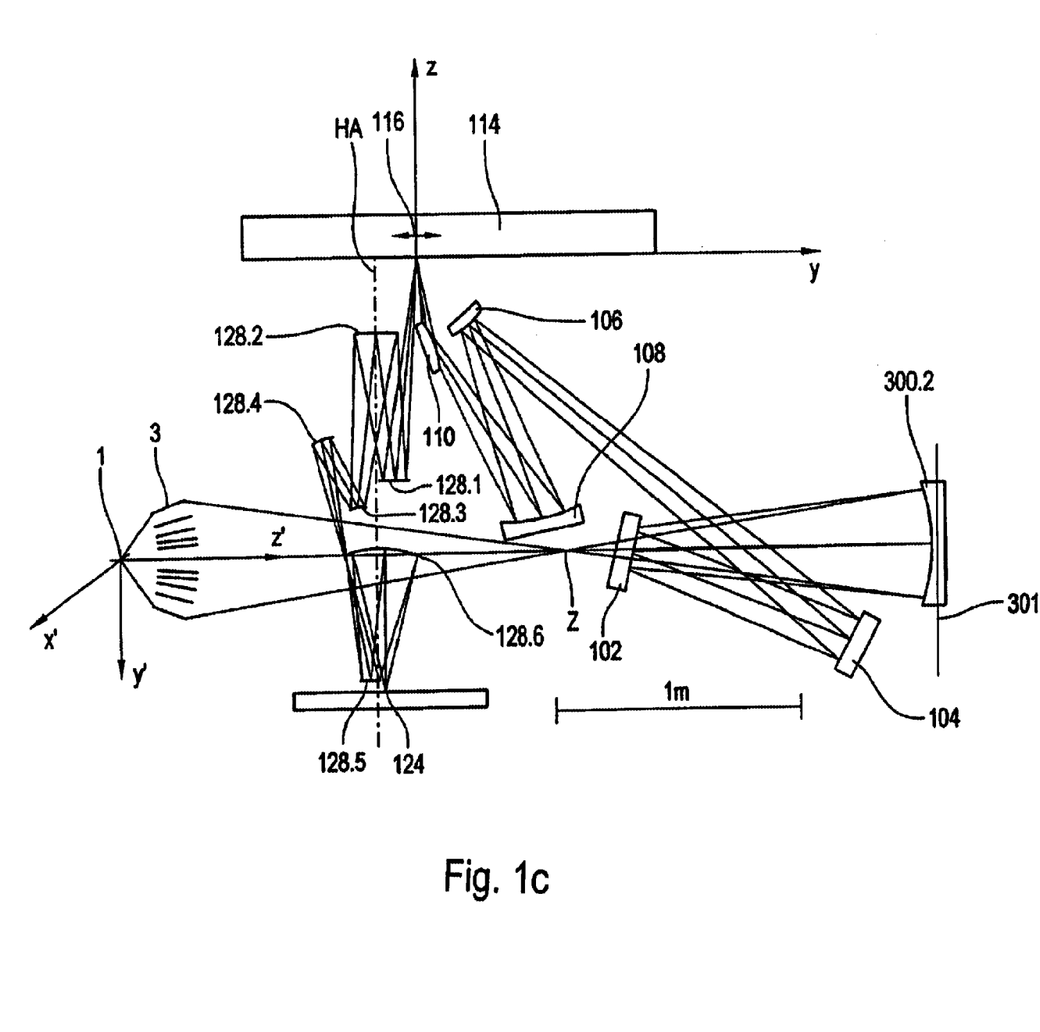
FIG. 1c shows a structure, in principle, of a projection exposure system with an illumination system according to the present invention with two collectors, a nested collector and a normal incidence collector and an intermediate image.

FIG. 1c shows another embodiment of a projection exposure system that includes an illumination system and a projection objective. The illumination system comprises light source 1, collectors 3 and, first optical element 102, second optical element 104, and mirrors 106, 108 and 110. The projection objective comprises mirrors 128.1, 128.2, 128.3, 128.4, 128.5 and 128.6. The illumination system illuminates a reticle (not shown) that is situated in field plane 114. The projection objective projects an image of the reticle onto light sensitive object 124.

Collector 300.2 is formed as a normal-incidence collector. Note that this is in contrast with the embodiment according to FIG. 1a where collector 300.1 is a nested collector. Components that are the same in FIGS. 1a and 1c are given the same reference numbers.

For collector 300.2, the angles of incidence are less than 30° relative to a surface normal line. Collector 300.2 is designed as an ellipsoid mirror, i.e., it focuses a beam bundle exiting from intermediate image Z of light source 1 in such a way that the raster elements of first optical element 102 can be formed as planar facets, as described above and disclosed in U.S. Pat. No. 6,198,793 B1, the disclosure content of which is fully incorporated in the present application.

The illustration of FIG. 1c is in a two-dimensional drawing plane, and consequently, lines representing light rays in a beam path from collector 3, through intermediate image Z to collector 300.2 appear to intersect with other lines representing light rays between other components. However, in practice in a three-dimensional embodiment the beam path from light source 1 to collector 300.2 is outside the plane of the drawing, i.e., light rays from collector 3, through intermediate image Z to collector 300.2 do not cross light rays between other components of the system.

Figure 5:
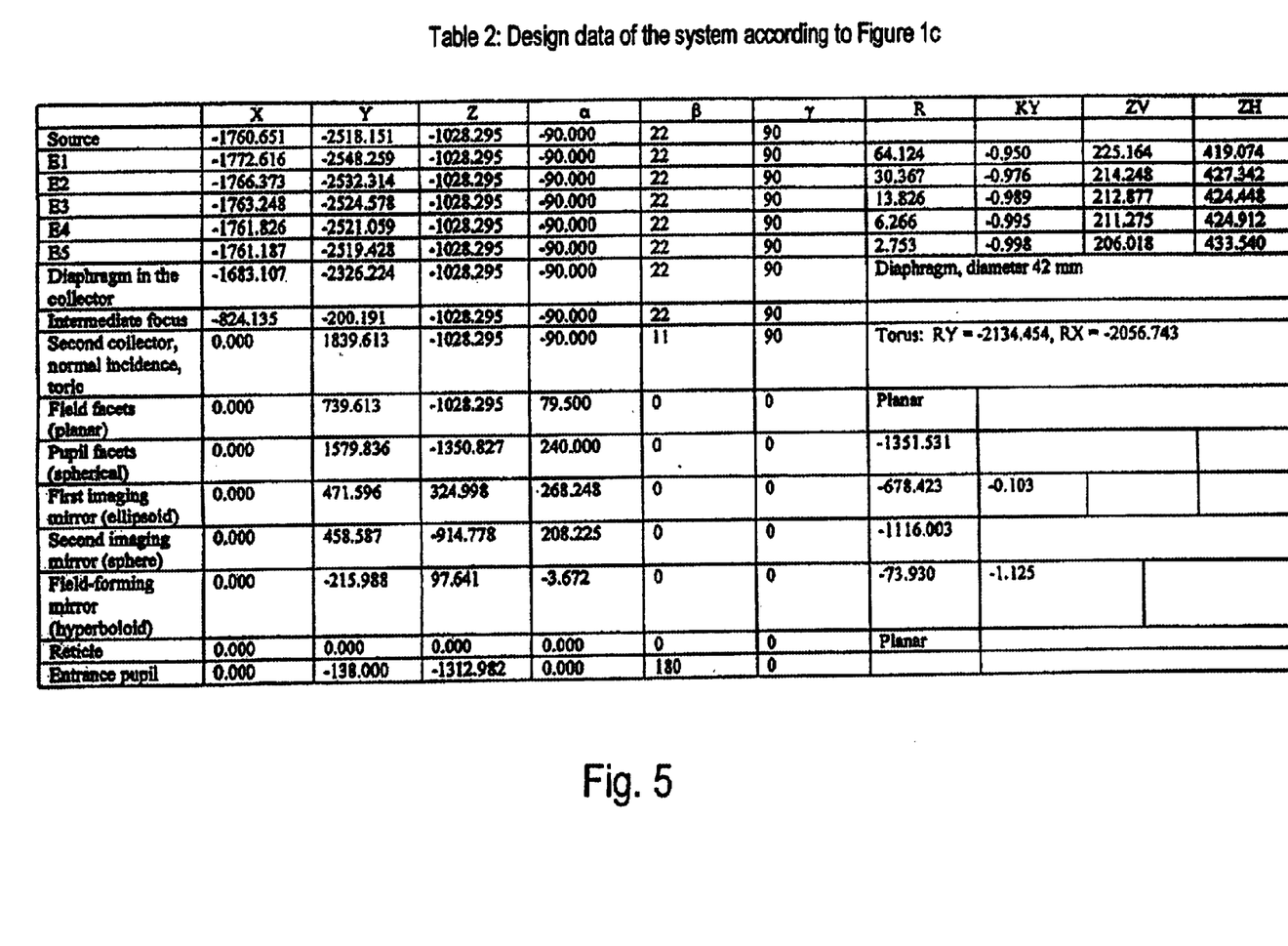
FIG. 5 is a presentation of Table 2, which provides design data for the system according to FIG. 1c.

FIG. 5 is a presentation of Table 2, which provides design data for the system according to FIG. 1c. Table 2 gives surface vertex and surface parameters of the embodiment of FIG. 1c. For Table, 2, as in Table 1, the surface vertices are referred to a reference coordinate system in field plane 114, in which the reticle is situated. The local coordinate systems at the surface vertex are obtained by translating the local coordinate system with reference to the reference coordinate system in field plane 114 by a translating vector having an x, y and z-value and subsequent rotation first by angle α around the x-axis. After this the coordinate-system rotated about the angle α is further rotated about the y-axis of the rotated coordinate-system by angle β. Finally the coordinate-system already rotated about the angles α and β is further rotated about the angle γ around the z-axis of the doubly rotated coordinate system. The coordinates ZV, ZH of a shell of a nested collector are explained in the description to FIG. 1b.

In the illumination systems shown in FIGS. 1a and 1c, a raster element of second optical element 104 is assigned to each raster element of first optical element 102: i.e., there is a one-to-one correlation between the raster elements of first optical element 102 and the raster elements of second optical element 104. The angles of inclination of the raster elements of first optical element 102 are selected such that the secondary light sources formed by the raster elements of first optical element 102 are formed at the site of the assigned raster elements of second optical element 104. The angles of inclination of the raster elements of second optical element 104 are selected such that the images of the raster elements of first optical element 102 are superimposed in field plane 114. The raster elements of first optical element 102 are constructed of planar facets in both examples of embodiment.

Using planar facets as the raster elements of first optical element 102 has particular advantages relative to technical production. Assume that a collector system includes two collectors, for example, collectors 3 and 300.1 in the embodiment of FIG. 1a or collectors 3 and 300.2 in the embodiment of FIG. 1c. The use of planar facets as the raster elements of first optical element 102 is possible if the collector system is configured to image light source 1 in the plane in which second optical element 104 is arranged. If only a single raster element is arranged on first optical element 102, this would lead to a single secondary light source. A plurality of secondary light sources is formed by the plurality of raster elements of first optical element 102. The plurality of raster elements of first optical element 102 are formed as planar facets and distribute the secondary light sources in the plane in which second optical element 104 is arranged. The distribution of the secondary light sources is influenced by the angle of inclination of the raster elements of first optical element 102. A positive optical refractive power for focusing an incident beam bundle in secondary light sources is completely accommodated by the collector unit.

The optical distance between an image-side principal plane 301 of collector 300.1 or 300.2 and the image plane of collector 300.1 or 300.2, which is not shown presently, is given approximately by the sum of the optical distances between image-side principal plane 301 of collectors 300.1 or 300.2 and first optical element 102 and the optical distance between first optical element 102 and the plane in which second optical element 104 is arranged. The sum, in other words, is the sum of two distances, i.e., the distance between the principal plane and first optical element 102 and the distance between first optical element 102 and second optical element 104. Since the raster elements on first optical element 102 are shaped in a planar manner, they do not influence the imaging of light source 1 in secondary light sources, other than splitting of light from light source 1 into a plurality of light sources based on the angle of inclination. Depending on the positive optical refractive power of collector 300.1 or 300.2, the raster elements of first optical element 102 may also have positive or negative optical refractive power.

Figure 2:
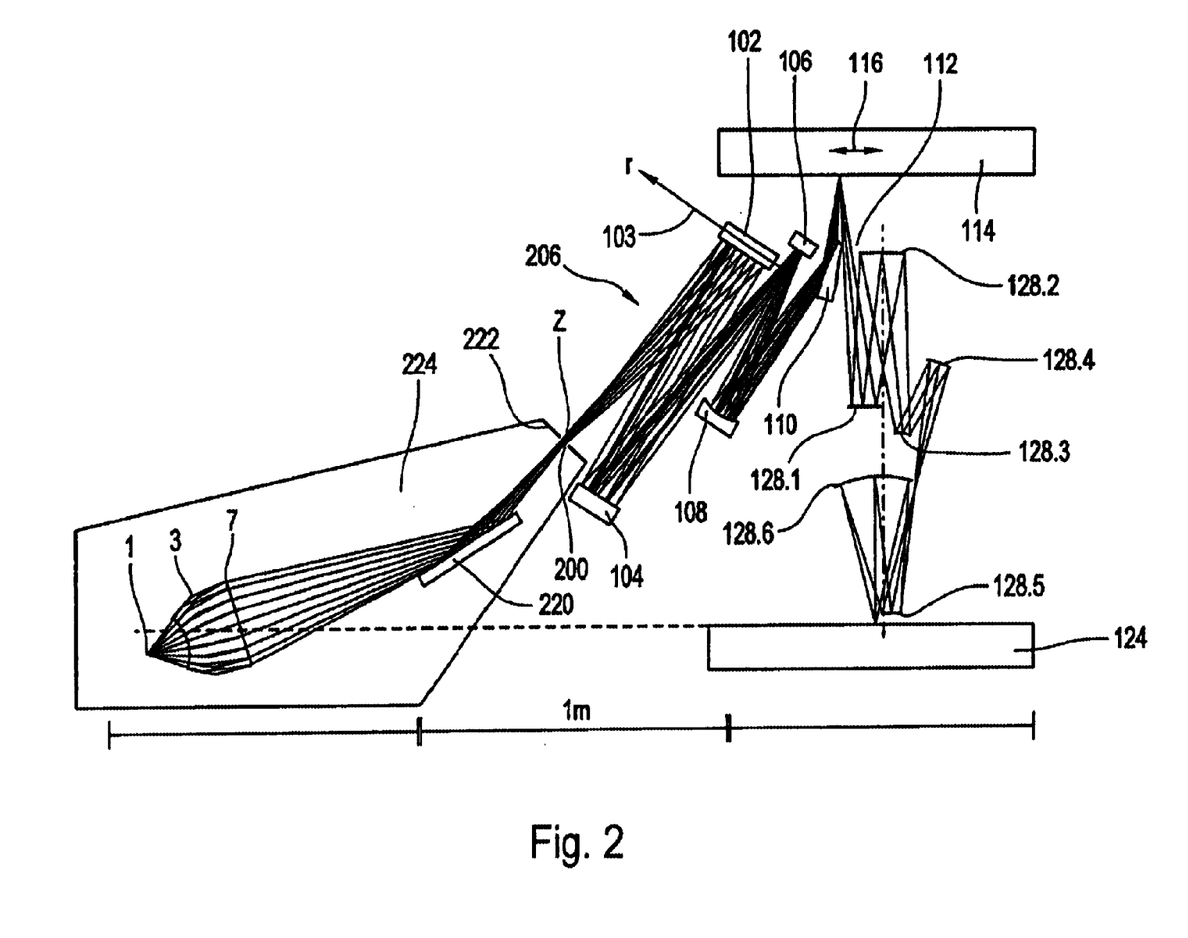
FIG. 2 shows a projection exposure system with an illumination system according to the present invention, having an intermediate image, a nested collector in front of the intermediate image and a grating spectral filter.

FIG. 2 shows an EUV exposure system that is divided by the system shown in FIGS. 1a and 1c in such a way that no other collector is arranged after the intermediate image Z. Components in FIG. 2 that are the same as those in FIGS. 1a and 1c are given the same reference numbers.

The system of FIG. 2 includes an 8-shell nested collector, i.e. collector 3, as is utilized in the system according to FIG. 1a. The system of FIG. 2 also includes optical components such as first optical element 102, second optical element 104, and mirrors 106, 108 and 110. In addition, a planar mirror 220 for folding the system is positioned after collector 3 to provide structural spaces for mechanical and electrical components in a plane 124. A wafer stage is arranged in plane 124. FIG. 2 shows a beam path of several light rays.

Planar mirror 220 in the embodiment of FIG. 2 has been designed as a diffractive spectral filter, i.e., by a grating with an angle of diffraction of 2° between the 0 order and the diffraction order utilized. Together with a diaphragm 222 in the vicinity of intermediate image Z of light source 1, undesired radiation with wavelengths that are, for example, larger than a desired wavelengths, 13.5 nm in the present case, can be prevented from entering into the part of the illumination system lying behind, i.e., after, diaphragm 222.

Diaphragm 222 may also serve for spatially separating a first portion of the illumination system containing light source 1, collector 3, and planar mirror 220, from a second, subsequent portion of illumination system. If the two spaces, i.e., the first and second portions, are to be separated by introducing a valve near the intermediate image Z of the light source, then a pressure separation is also possible.

Contaminations that arise from light source 1 can be prevented from reaching the illumination system lying behind diaphragm 222 by the spatial or pressure separation.

Figure 6:
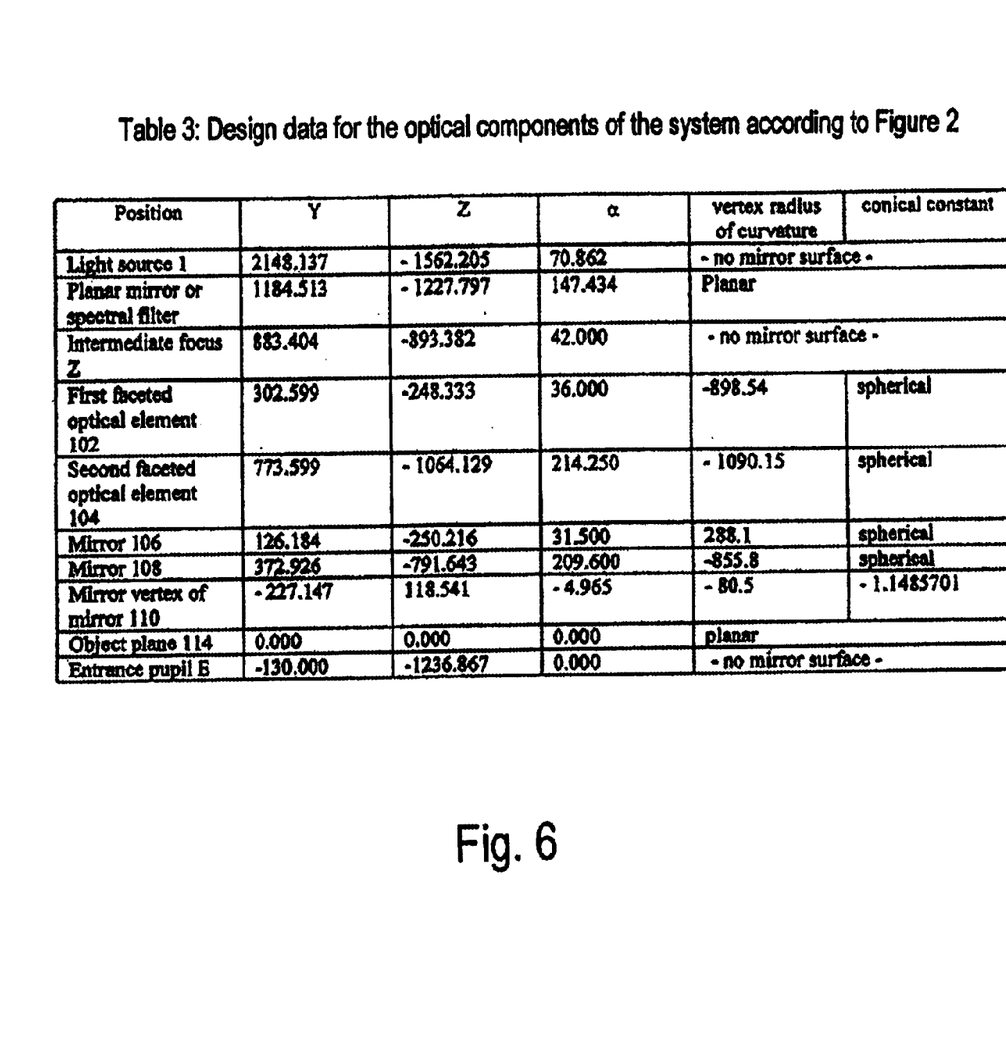
FIG. 6 is a presentation of Table 3, which provides design data for the optical components of the system according to FIG. 2.

First optical element 102 comprises 122 raster elements, each with dimensions of 54 mm×2.75 mm. Second optical element 104 has 122 raster elements, each with a diameter of 10 mm, assigned with a one-to-one correspondence to the raster elements of first optical element 102. FIG. 6 is a presentation of Table 3, which provides design data for the optical components of the system according to FIG. 2. All position data of the optical components in Table 3 are referred to the reference coordinate system in field plane 114, in which the reticle is arranged. In addition, these are based on right-handed coordination systems and rotation in the clockwise direction. The local coordinate systems of the intermediate image Z and an entrance pupil E are indicated in addition to the local coordinate systems of the optical components. Mirror 110, which serves for field shaping, is comprised of an off-axial segment of a rotation hyperboloid. R denotes the radius of curvature and K the conical constant of the respective optical element.

Figure 3A:
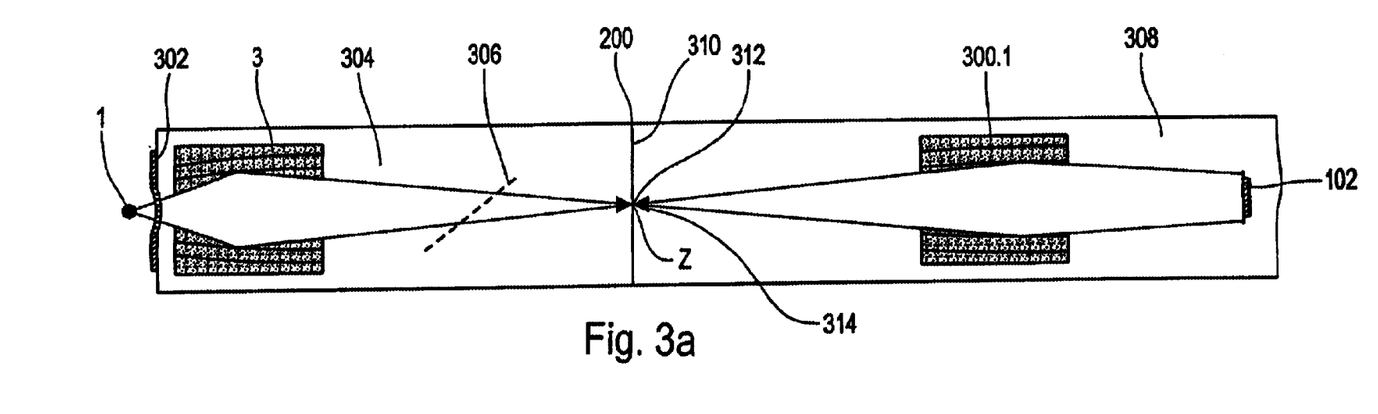
FIGS. 3a–3b show projection exposure systems with means for spatial separation of a first space from a second space.

The embodiment of the present invention according to FIG. 1a is shown in more detail in FIG. 3a. The embodiment according to FIG. 3a, like the system according to FIG. 1a, comprises a collector system with two collectors, i.e., collectors 3 and 300.1, both of which are designed as nested collectors. Light of light source 1 in the object plane reaches collector 3, and is focused in plane 200 conjugated to the object plane. Intermediate image Z of light source 1 is formed in plane 200. A foil trap 302 is arranged between light source 1 and collector 3. Such a foil trap 302 is shown, for example, in WO 99/42904, the disclosure content of which is fully incorporated in the present application. Foil trap 302 serves for filtering macroparticles, microparticles, clusters of microparticles as well as atoms or ions and for preventing such particles from reaching a first space 304, in which collector 3 is arranged.

In first space 304, pressures of less than $10^{-3}$ mbars of xenon and less than $10^{-2}$ mbars each of argon and helium prevail. A pressure of hydrocarbons $C_xH_y$ amounts to less than $10^{-7}$ mbars and that of $H_2O$ amounts to less than $10^{-9}$ mbars. In addition, a grating spectral filter is optionally arranged in space 304. The grating spectral filter comprises a grating element 306 as well as a physical diaphragm, which presently is represented by a spatial diaphragm 310 for the separation of first space 304 from second space 308. Grating element 306 produces light bundles of different diffraction orders, each with one focal point. The focal point of one of the different diffraction orders other than the 0 diffraction order, preferably the −1 or +1 diffraction order, comes to lie in the diaphragm aperture of the physical diaphragm, presently spatial diaphragm 310. In this way, radiation with undesired wavelengths can be filtered out, so that the light bundle after the physical diaphragm contains only radiation with a wavelength, for example, of 7 to 26 nm. In this way, a spectral filtering is achieved.

First space 304 is spatially separated from the subsequent illumination system, which is arranged in second space 308, by spatial diaphragm 310. Spatial diaphragm 310 has an aperture 312. Aperture 312 preferably has a maximum diameter of less than 15 mm. A valve device 314 can be arranged in the region of aperture 312.

First space 304 has a first vacuum and second space 308 has a second vacuum. The first and second vacuums are separated from one another by valve device 314 such that debris that may reach first space 304, such as, for example, Xe or Li gas from light source 1, electrode material of light source 1 or any other type of particle, does not reach second space 308 and thus does not degrade the optical components arranged therein. A valve device such as valve device 314 also makes possible a complete separation of the vacuum in first space 304 from the vacuum in second space 308, so that a first unit, which is arranged in first space 304 and which is comprised of light source 1, collector 3 and grating element 306, can be exchanged or cleaned separately from the optical components arranged in second space 308.

The vacuums of first space 304 and second space 308 are separated from one another by means of differential pumping segments. By introducing a second collector, i.e. collector 300, in the beam path in second space 308 in front of first optical element 102, it is possible that the raster elements of first optical element 102 can be formed without refractive power, i.e., as planar facets as described above.

In addition to separating the vacuum of first space 304 from that of the second space 308, spatial diaphragm 310 also effects a simple mechanical separation of optical components in first space 304 from optical components in second space 308, and provides a simple means for effective shielding of heat radiation. For this purpose, spatial diaphragm 310 can be provided with, for example, a material that absorbs infrared (IR) radiation. The heat that then enters into the spatial diaphragm 310 can be transported out, for example, by means of cooling devices.

In forming the mirror shells of collector 300, it is advantageous if the vignettings of second collector 300 lie in the shadow of collector 3.

Figure 3B:
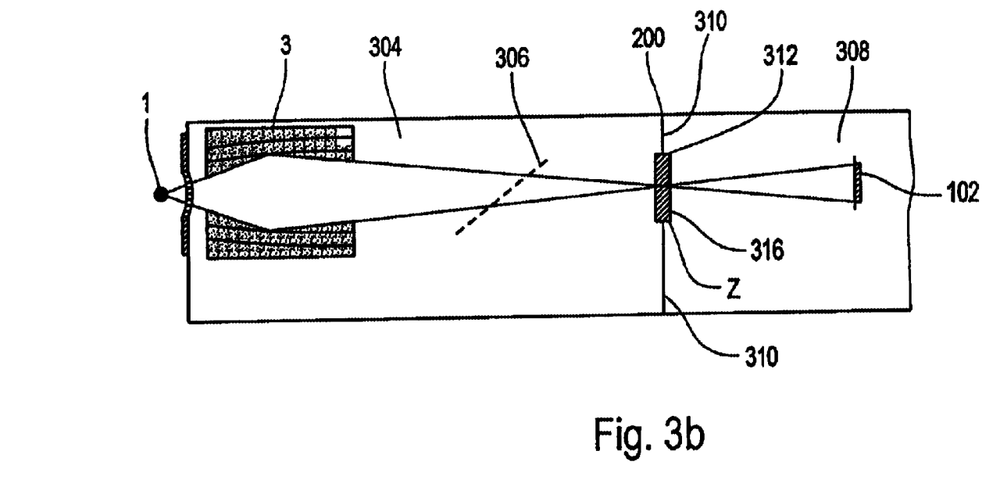

An alternative form of embodiment of an illumination system according to the present invention is shown in FIG. 3b. Like the form of embodiment according to FIG. 3a, the illumination system comprises a nested collector, i.e. collector 3, which is arranged in first space 304. Like the embodiment according to FIG. 3a, the system has an intermediate image Z of light source 1 in plane 200 conjugated to the object plane. A spatial diaphragm 310, which comprises a foil trap 316, is arranged in or near plane 200 for spatial separation of first space 304 from the second space 308. As in the case of FIG. 3a, the penetration of debris into second space 308 is greatly reduced by differential pumping of first space 304 and second space 308. In addition, the form of embodiment according to FIG. 3b only has a single collector, i.e., collector 3 in first space 304. In order to produce secondary light sources in a doubly faceted illumination system, it is necessary in the form of embodiment according to FIG. 3b, that the raster elements on first optical element 102 have an optical refractive power.

The present invention gives for the first time an illumination system, in which debris of a light source and residual gas concentration, which are introduced into a vacuum by the light source, particularly a plasma source, does not adversely affect the optical components of the illumination system relative to its effectiveness, for example, its reflectivity.

What is claimed is:

1. An illumination system for wavelengths of $\leq 193$ nm, comprising:
 an object plane;
 a plane conjugated to said object plane;
 a first collector;
 a second collector; and
 a light path from said object plane to said second collector,
 wherein said first collector is situated in said light path between said object plane and said conjugated plane,
 wherein said second collector is situated in said light path, downstream of said conjugated plane,
 wherein said first collector focuses a beam bundle of rays from said object plane into said conjugated plane so that an image of an object situated in said object plane is formed in said conjugated plane,
 wherein at least one of said first and second collectors includes a mirror shell arranged rotationally symmetric around an axis of rotation, and
 wherein said rays strike said mirror shell at an angle of incidence of less than 20° relative to a surface tangent of said mirror shell.

2. The illumination system of claim 1,
 wherein said mirror shell is a member of a plurality of mirror shells,
 wherein said axis of rotation is a common axis of rotation for said plurality of mirror shells, and
 wherein said plurality of mirror shells is for collecting radiation from a light source and reflecting said radiation towards a field plane.

3. The illumination system of claim 1, wherein said mirror shell comprises a first segment that is a segment of a hyperboloid and a second segment that is a segment of an ellipsoid.

4. The illumination system of claim 2, further comprising an optical element having a plurality of raster elements, wherein said optical element is situated in a light path from said light source to said field plane, and situated after said second collector and before said field plane.

5. The illumination system of claim 1, further comprising:
 a field plane for accommodating a pattern-bearing mask; and
 an optical element for directing said rays to shape and illuminate a field in said field plane.

6. A projection exposure system for production of microelectronic components, comprising:
 the illumination system of claim 1; and
 a projection objective,
 wherein said illumination system is for illuminating a pattern-bearing mask, and
 wherein said projection objective is for imaging said pattern-bearing mask onto a light-sensitive object.

7. A method for producing a microelectronic component, comprising using the projection exposure system of claim 6.

8. An illumination system for wavelengths of $\leq 193$ nm, comprising:
 an object plane;
 a plane conjugated to said object plane;
 a collector having a mirror shell such that rays of a beam bundle from said object plane strike said mirror shell at an angle of incidence of less than 20° relative to a surface tangent of said mirror shell, wherein said mirror shell is arranged rotationally symmetric around an axis of rotation, and wherein said collector is arranged between said object plane and said conjugated plane, and focuses said beam bundle in said conjugated plane; and
 a device in or near said conjugated plane, for separating said illumination system into a first space and a second space.

9. The illumination system of claim 8, wherein said device provides pressure separation of said first space from said second space.

10. The illumination system of claim 8, wherein said device provides shielding of heat radiation.

11. The illumination system of claim 8,
 wherein said mirror shell is a member of a plurality of mirror shells, and
 wherein said plurality of mirror shells is for collecting radiation from a light source and reflecting said radiation towards a field plane.

12. The illumination system of claim 11, wherein said plurality of mirror shells are arranged inside one another around a common axis of rotation (RA).

13. The illumination system of claim 11, wherein said plurality of mirror shells are annular segments of ellipsoids.

14. The illumination system of claim 8, wherein said mirror shell comprises a first segment that is a segment of a hyperboloid and a second segment that is a segment of an ellipsoid.

15. The illumination system of claim 8, further comprising an optical element having a plurality of raster elements, wherein said optical element is situated in a light path from a light source to a field plane, and situated after said collector and before said field plane.

16. The illumination system of claim 15, wherein said raster elements are planar facets.

17. The illumination system of claim 15,
 wherein said optical element is a first optical element,
 wherein said illumination system further comprises a second optical element having second raster elements, and
 wherein said second optical element is in said light path, and situated after said first optical element and before said field plane.

18. The illumination system of claim 8, further comprising:
 a field plane for accommodating a pattern-bearing mask; and
 an optical element for directing said rays to shape and illuminate a field in said field plane.

19. The illumination system of claim 18, wherein said field in said field plane is a segment of a ring field.

20. A projection exposure system for production of microelectronic components, comprising:
 the illumination system of claim 8; and
 a projection objective,
 wherein said illumination system is for illuminating a pattern-bearing mask, and
 wherein said projection objective is for imaging said pattern-bearing mask onto a light-sensitive object.

21. A method for producing a microelectronic component, comprising using the projection exposure system of claim 20.

22. An illumination system for wavelengths of ≦193 nm, comprising:

an object plane;

a plane conjugated to said object plane;

a collector having a mirror shell so that rays of a beam bundle from said object plane strike said mirror shell at an angle of incidence of less than 20° relative to a surface tangent of said mirror shell, wherein said collector is arranged between said object plane and said conjugated plane, and focuses said beam bundle in said conjugated plane;

a device in or near said conjugated plane, for separating said illumination system into a first space and a second space;

a first optical element having a plurality of first raster elements, wherein said first optical element is situated in a light path from a light source to a field plane and situated after said collector and before said field plane; and a second optical element having a plurality of second raster elements, wherein said second optical element is in said light path, and situated after said first optical element and before said field plane.

23. An illumination system for wavelengths of ≦193 nm, comprising:

an object plane;

a plane conjugated to said object plane;

a collector having a plurality of mirror shells, wherein rays of a beam bundle from said object plane strike said plurality of mirror shells at an angle of incidence of less than 20° relative to a surface tangent of each of said plurality of mirror shells, wherein said collector is arranged between said object plane and said conjugated plane, and focuses said beam bundle in said conjugated plane, and wherein said plurality of mirror shells are arranged inside one another around a common axis of rotation (RA).

24. The illumination system of claim 1, wherein said second collector has a focal length that is unequal to an optical distance between said image in said conjugated plane and said second collector.

25. The illumination system of claim 24, wherein said intermediate image is a first intermediate image, and wherein the illumination system further comprises a plurality of second intermediate images having an optical distance of less than 3 meters to said second collector.

26. The illumination system of claim 25, further comprising:

a first optical element for receiving light from said second collector; and a second optical element situated in a plane, for receiving said light from said first optical element, wherein said plurality of second intermediate images lie substantially in said plane.

27. The illumination system of claim 26, wherein said first optical element has a first plurality of raster elements for partitioning said light into a plurality of light bundles, and wherein said second optical element has a second plurality of raster elements for receiving said plurality of light bundles.

28. The illumination system of claim 25, further comprising:

a first optical element for receiving light from said second collector; and a field plane for receiving said light from said first optical element, wherein said plurality of second intermediate images is situated between said first optical element and said field plane.

29. The illumination system of claim 24, wherein said focal length is less than said optical distance.

* * * * *